United States Patent [19]

Lee et al.

[11] Patent Number: 4,946,735

[45] Date of Patent: Aug. 7, 1990

[54] ULTRA-THIN SEMICONDUCTOR MEMBRANES

[75] Inventors: Kevin C. Lee; Charles A. Lee; John Silcox, all of Ithaca, N.Y.

[73] Assignee: Cornell Research Foundation, Inc., Ithaca, N.Y.

[21] Appl. No.: 284,821

[22] Filed: Dec. 14, 1988

Related U.S. Application Data

[63] Continuation of Ser. No. 828,564, Feb. 10, 1986, abandoned, which is a continuation of Ser. No. 464,835, Feb. 8, 1983, abandoned.

[51] Int. Cl.$^5$ ............... H01L 21/306; H01L 21/465; H01L 49.02
[52] U.S. Cl. ................... 428/220; 148/33; 148/900; 148/DIG. 3; 148/DIG. 5; 148/DIG. 42; 148/DIG. 56; 148/DIG. 58; 148/DIG; 148/64; 148/DIG. 65; 148/DIG. 83; 148/DIG. 119; 148/DIG. 135; 156/628; 156/662; 428/333; 428/337; 428/409; 428/410; 428/446; 437/225; 437/247; 437/966; 437/974
[58] Field of Search ............... 148/33, 900, DIG. 3, 148/DIG. 5, DIG. 42, DIG. 56, DIG. 58, DIG. 64, DIG. 65, DIG. 83, DIG. 119, DIG. 135; 156/628, 662; 427/82, 85; 428/220, 333, 337, 409, 410, 446; 437/225, 247, 966, 974

[56] References Cited

U.S. PATENT DOCUMENTS

| | | | |
|---|---|---|---|
| 3,534,467 | 10/1970 | Sachs et al. | 437/966 |
| 3,647,581 | 3/1972 | Mash | 437/966 |
| 3,993,533 | 11/1976 | Milnes et al. | |
| 4,092,209 | 5/1978 | Ipir | 156/628 |
| 4,093,503 | 6/1978 | Harris et al. | 156/628 |
| 4,108,715 | 8/1978 | Ishikawa et al. | 156/628 |
| 4,172,906 | 10/1979 | Pancholy | 427/82 |
| 4,177,298 | 12/1979 | Shigeta et al. | 427/85 |
| 4,228,452 | 10/1980 | Losee et al. | 427/85 |
| 4,230,505 | 10/1980 | Wu et al. | 437/974 |
| 4,234,361 | 11/1980 | Guckel | 156/628 |
| 4,255,208 | 3/1981 | Deutscher et al. | 437/966 |
| 4,256,532 | 3/1981 | Magdo et al. | 156/628 |
| 4,262,056 | 4/1981 | Hubler et al. | 428/446 |
| 4,267,014 | 5/1981 | Davey et al. | 427/85 |
| 4,308,078 | 12/1981 | Cook | 437/966 |
| 4,313,773 | 2/1982 | Briska et al. | 156/628 |
| 4,338,362 | 7/1982 | Turcotte | 437/966 |
| 4,341,588 | 7/1982 | Sterling | 437/966 |
| 4,343,676 | 8/1982 | Tarng | 156/628 |
| 4,454,002 | 6/1984 | Hankins | 437/966 |
| 4,509,990 | 4/1985 | Vasudev | 437/974 |
| 4,525,223 | 6/1985 | Tsuya et al. | 437/966 |
| 4,601,779 | 7/1986 | Abernathy et al. | 437/974 |
| 4,702,965 | 10/1987 | Fang | 437/225 |
| 4,727,047 | 2/1988 | Bozler et al. | 437/966 |
| 4,880,493 | 11/1989 | Ashby et al. | 156/662 |

FOREIGN PATENT DOCUMENTS 2169442 7/1986 United Kingdom .

OTHER PUBLICATIONS

Meeks et al., *Nuclear Instruments and Methods*, vol. 94, No. 3 (1971), 435-442.

(List continued on next page.)

*Primary Examiner*—James C. Cannon
*Attorney, Agent, or Firm*—Jones, Tullar & Cooper

[57] ABSTRACT

This invention relates to ultra-thin semiconductor films which can be in the submicron range formed from semiconductor materials such as silicon, germanium and gallium aresenide. The films are formed by creating a thin slightly damaged surface on the polished reverse side of a film (e.g., a wafer) of the semiconductor by low dose ion implantation and then etching the semiconductor material on the front side of the film to remove the semiconductor material down to the ion implanted damaged layer. While the implanted ions can be chosen from functionally desirable ions which upon annealing remain in the film to alter the original electrical characteristics, the implanted ions can also be chosen so that upon annealing, the resultant ultra-thin semiconductor film has the same electrical characteristics as the original semiconductor material.

The ion implantation changes the etching characteristics of the ion implanted layer. Thus, when the partially damaged semiconductor material is exposed to an etchant the etching rate in the damaged region is decreased by a factor of several thousand as compared to the undamaged semiconductor material.

22 Claims, 1 Drawing Sheet

OTHER PUBLICATIONS

Memming et al., *Surface Science* (1966), 4:109–124.
Finne et al., *Electrochem Soc.* (1967), 114:965–970.
van Dijk et al., *Jour. Electrochem. Soc.* (1970), 117:553–554.
Huang et al., *Appl. Phys. Lett.* (1974), 25:753–756.
Gibson et al., Projective Range Statistics: Semiconductors and Related Materials (Halstead Press:2nd edit., 1975).
Kelly et al., *Phys. Stat. Sol.* (1975), (a) 31:771–780.
*IEEE Trans. on Electron. Devices* (1976), D-23:579–583.
Huang et al., *IEEE Transactions on Electron. Devices (1976), 23:579–583*.
Vokes et al., *Electronics Letters* (1979), 15:627–629.
Griffiths et al., *Electronics Letters* (1979), 15:629–630.
Lee et al., *Appl. Phys. Lett.* (1983), 43:488–489.

Bereny et al., Proc. Eight Biennial Cornell Conf. on Active Mircrowave Semicondutor Devices and Circuits, Aug. 12, 1981, pp. 75–85.
Lee et al., *J. Appl. Phys.* (1983), 54:4035–4037.

ULTRA-THIN SEMICONDUCTOR MEMBRANES

GOVERNMENT FUNDING

The invention described and claimed herein was at least in part supported by the National Submicron Facility under NSF Grant #ECS-8200312 to the NRRFSS.

This is a continuation of application Ser. No. 828,564, filed Feb. 10, 1986, which is a continuation of application Ser. No. 464,835, filed Feb. 8, 1983 both abandoned.

BACKGROUND OF THE INVENTION

The availability of device quality, uniform, large area semiconductor films with submicron thicknesses offers the possibility of the first accurate determination of many important physical parameters, such as elastic and inelastic electron scattering cross sections, in addition to enabling the fabrication of new devices, such as the Opposed Gate Source Transistor (OGST), with much higher performance than those currently available; [see Berenz et al., Proc. Eighth Biennial Cornell Conf. on Active Microwave Semiconductor Devices and Circuits, Aug. 12, 1981, pp. 75–85].

There are currently only two techniques for producing thin, self-limited films of silicon. The first one uses an ethylene diamine-pyrocatachol-water solution to fabricate highly boron doped submicron films of silicon; [see Huang et al., Appl. Phys. Ltrs, 25: (1974) 753; IEEE Trans. on Electron Devices, D-23 (1976) 579–583; and Finne et al., Jour. Electrochem. Soc., 114 (1967) 965–970]. This technique, however, is only applicable to silicon, and even so produces degenerately doped films with a high dislocation density; [see Yeh et al., Jour. Electrochem. Soc., 116 (1969) 73–77]. In the second technique, wafers of n+ silicon with n-type epitaxial layers were anodically etched to produce device quality films of n-type silicon. The thinnest films that could be produced in this manner, however, were only about 2 microns thick; [see van Dijk et al., Jour. Electrochem. Soc., 117 (1970) 553–554].

DESCRIPTION OF THE INVENTION

This invention relates to ultra-thin semiconductor films which can be in the submicron range formed from semiconductor materials such as silicon, germanium and gallium arsenide. The films are formed by creating a thin, slightly damaged surface on the polished reverse side of a film (e.g., a wafer) of the semiconductor by low dose ion implantation and then etching the semiconductor material on the front side of the film to remove the semiconductor material down to the ion implanted damaged layer. While the implanted ions can be chosen from functionally desirable ions which upon annealing remain in the film to alter the original electrical characteristics, the implanted ions can also be chosen so that upon annealing, the resultant ultra-thin semiconductor film has the same electrical characteristics as the original semiconductor material.

The ion implantation changes the etching characteristics of the ion implanted layer. Thus, when the partially damaged semiconductor material is exposed to an etchant the etching rate in the damaged region is decreased by a factor of several thousand as compared to the undamaged semiconductor material.

The new process of the invention enables the fabrication of significant areas of films of device quality semiconductors in the thickness range down to tens to hundreds of nanometers, using a self-limiting process.

Figure 2:
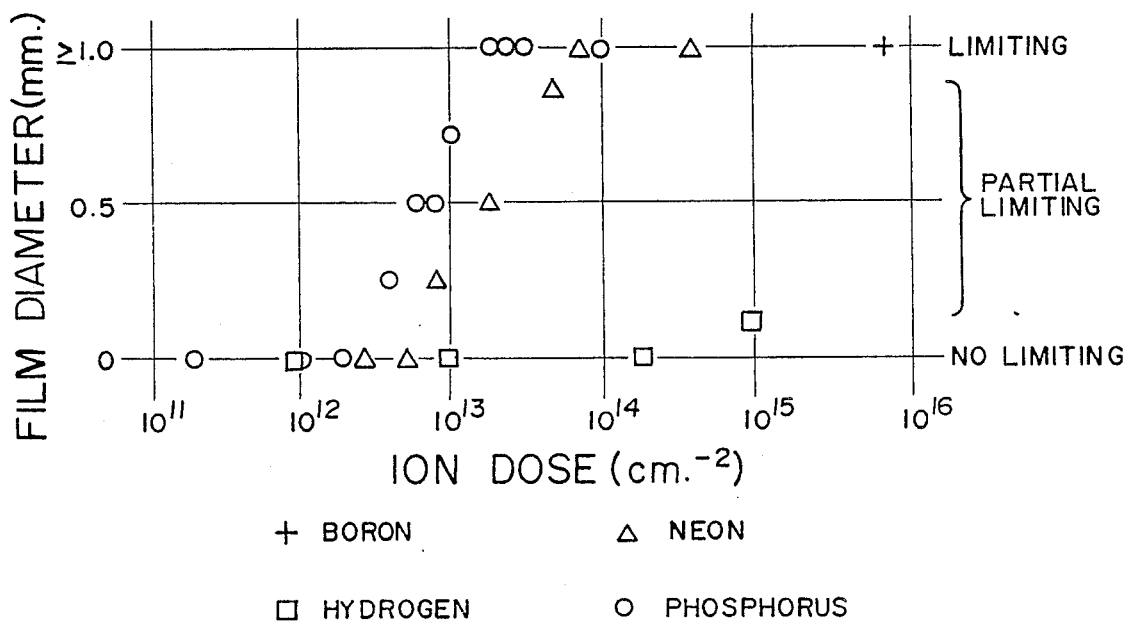
FIG. 2 is a graph of film diameter as a function of the ion dose, for phosphorus, neon, boron, and hydrogen implants into silicon at 100 KeV. The upper line marked "limiting" indicates that limiting action was complete, and films of nearly any diameter up to the three millimeter limit set by our etching apparatus could be obtained. It is interesting to note that limiting action was obtained even when such high doses ($7 \times 10^{15}$/cm$^2$ of boron) were used that the surface layer became totally amorphous.

In the process of the invention a film of semiconductor material is implanted on a major first side (herein also called the reverse side) to a predetermined depth, which is less than the total thickness of the film, with ions of a type and in an amount sufficient to create a damaged (crystal lattice damaged) region near the surface of the semiconductor material. As a result of ion implantation damage, upon etching the rate of dissolution of the semiconductor in the damaged region is considerably slowed down when the implanted layer is exposed to an etching process. Thus an etching process allows removal of areas of undamaged semiconductor material to provide essentially flat thin films of ion implants. The ratio between the etch rate of the original substrate and the implanted layer is sufficiently different to allow fabrication of large area submicron films (see FIG. 2). In the case of silicon, germanium and gallium arsenide the ratio between the etch rate of the substrate and the implanted layer was measured to be greater than several thousand to one.

The process of the invention can be employed with monocrystalline semiconductor materials broadly. These materials are known in the art. They include for example, elemental crystals as well as binary compound crystals and include materials such as silicon, germanium, doped diamond, gallium arsenide, indium arsenide, AlN, GaN, InN, ZnS, CdS, AlP, GaP, InP, ZnSe, CdSe, AlAs, ZnTe, CdTe, AlSb, GaSb, InSb, $Al_xGa_{1-x}As$, $InAs_xP_{1-x}$, $Ga_xIn_{1-x}As_yP_{1-y}$. The presently preferred materials include silicon, germanium and gallium arsenide.

The starting film is generally in the range of 10 to 50 microns, but is not unduly critical with the exception that the film be thicker than the range of the ions implanted under the conditions of implantation so that a film having a damaged layer and an undamaged layer results. Typically a wafer having a thickness of about 100 to 700 microns is etch polished to provide the starting wafer of a predetermined desired size.

The ions employed to implant and damage the predetermined layer of semiconductor material can be virtually any ion which can be accelerated and which damages the crystal structure of the starting semiconductor material. The ions implanted may be donor ions, acceptor ions or electrically neutral ions. The choice of the particular ion employed is at least in part based upon the properties of the starting material and the desired properties in the final ultra-thin film. The useful ions include ions which are known as dopant ions for the particular semiconductor material employed in the process of the invention. For example with silicon and germanium ions selected from Groups III and V of the Periodic Table can be employed. For gallium arsenide ions selected from Groups II, IV and VI of the Periodic Table can be employed. In addition inert gases such as neon and xenon and also hydrogen ions can be employed. While the process of the invention is discussed in terms of a single ion type, if desired, more than one ion can be employed. Where the ion is a donor or acceptor ion, after annealing, the resultant film is appropriately doped for the fabrication of a semiconductor device. When the ion is an electrically neutral ion, such as neon, after annealing the resultant semiconductor device has the same electrical characteristics as the original starting film. It is pointed out that for the purposes of this invention, ions which are the same as the material forming the starting film are considered "electrically neutral ions" since after annealing they do not change the electrical characteristics of the final film from that of the starting film. Presently preferred ions include hydrogen, phosphorus, boron, neon, xenon, silicon, germanium and tin.

It is believed that the crystal lattice damage caused by the ion implantation drastically reduces the lifetime of holes in the damaged layer of the semiconductor material. This results in a change in the electrical properties of the layer and in the dissolution rate when the layer is exposed to an appropriately selected etchant.

The ion dosage necessary to limit the dissolution or etching process is quite small. The exact dose is dependent on the particular semiconductor material employed and the ion employed. The limiting action of the implanted layer is only dependent on the damage produced by implantation, which is proportional to $dE_n/dx$, i.e., the nuclear energy loss per unit path length of the implanted ion. For ions where the nuclear scattering is more significant than the electronic scattering, the $dE_n/dx$ will be inversely proportional to the projected ranges of the ions in the semiconductor material. Thus the ratio of the critical dosages below which the implanted layers fail to limit the dissolution process for two different ions will be proportional to the ratio of their projected ranges. This is observed: as can be seen from FIG. 2, the critical dosage for neon is $7 \times 10^{12}/cm^2$ and for phosphorus is $3 \times 10^{12}/cm^2$; the projected range of 100 KeV neon ions in silicon is 0.300 microns, and that of 100 KeV phosphorus ions is 0.124 microns. Thus it is seen that the ratio of the critical dosages is 2.3, which is quite close to the ratio of the projected ranges, namely 2.4.

The limiting effect is not dependent on the introduction of a large amount of crystalline disorder, for no amorphous rings were observed in electron diffraction patterns taken from unannealed films.

Typically, the ion dosage necessary to limit the dissolution process is between about $10^{10}$ to $10^{16}$ ions per $cm^2$ and can be readily determined for a given ion and a given semiconductor material.

The means for generating high energy implanted ions and the procedure and conditions necessary to implant ions in a semiconductor material using ion beams are well known in the art and will not be discussed in detail. The implantation conditions chosen will vary with the semiconductor material, its thickness and the desired thickness of the ultimate film sought to be prepared and the range or energy of the ion implanted. Ion energies as low as 5 KeV ions have been employed to successfully implant semiconductors. Presently ions having energies of 40 KeV or higher are typically employed. It is noted that the beam current employed should be less than that which would heat the semiconductor to such an extent that the heat would anneal the crystal damage sought to be caused. This is not a significant problem unless very large powerful beams were employed.

Figure 1:
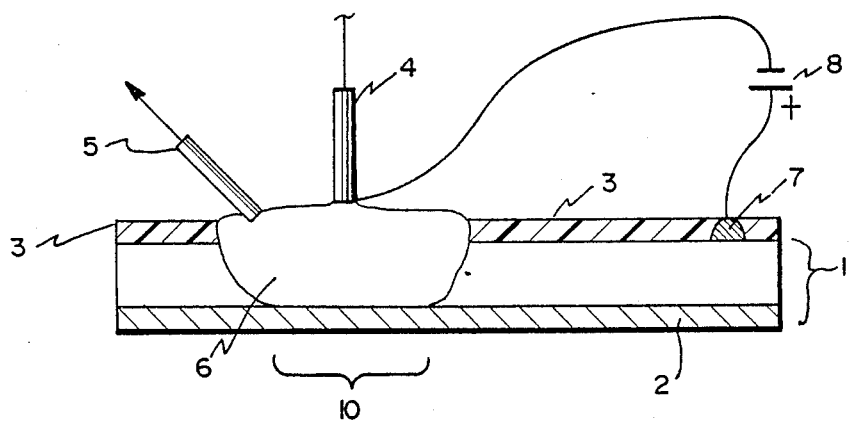
FIG. 1 is a schematic representation of an etching process employed in the process of this invention.

The thin films are formed by etching undamaged semiconductor material from the front side (the side opposite the implantation, or reverse, side) of the implanted damaged semiconductor film. The presently preferred anodic etching process is schematically represented in FIG. 1 wherein a semiconductor material 1, having an ion implanted damaged layer 2, is masked with a relatively etchant impervious non-conducting material, for example, a wax. An electrical circuit with power source 8 is established between the film 1, for example, through metallic contact 7, and an etchant conduit 4 to anodically etch the undamaged portion of the film, the etching action being self limiting at the damaged portion of the semiconductor material to form an ultra thin film 10. The etchant solution is removed from the work area by an aspirator 5 at a rate which controls the amount of etchant maintained in the work area and to allow for continuing removal of the etchant solution. After etching, the masking material can be removed by a solvent and if desirable, the thin film, preferably with surrounding support material can be trimmed from the workpiece.

As the ultra thin film is fragile, it is most desirable to handle the film in a unit surrounding thicker areas of semiconductor material. Likewise, as the area of the ultra thin film increases, for mechanical strength, it is desirable to maintain bars of thicker material traversing the thin film to provide mechanical strength.

Generally the etching process employed in the process of the invention is an etching process which provides a differential dissolution rate between the damaged layer and the undamaged layer of the semiconductor material so that the etching process is essentially self limiting, allowing dissolution of the undamaged layer (usually only a portion of a larger area) to form a thin film which comprises the damaged layer. The etching process can be a simple solution etching process or can be an electrochemical etching process or photo etching process.

The exact composition of the etching composition is not critical beyond the requirement that it provide differential etching, as described above, under the etching conditions. The etching composition varies with the semiconductor material. Etching compositions useful with the various semiconductor materials are known in the art. For silicon and germanium, the presently preferred anodic process etchant comprises dilute hydrofluoric acid; the particularly preferred etchant solution comprising ammonium fluoride and hydrofluoric acid in an aqueous alcoholic solution, for example, 0.2 molar ammonium fluoride and 0.2 molar hydrofluoric acid in 60 percent isopropanol-water solution. Relatively dilute KOH can also be used to etch silicon, germanium and gallium arsenide. The presently preferred anodic etchant for gallium arsenide comprises one part of 70 percent perchloric acid and 4 parts of glacial acetic acid. Three molar NaOH can also be used to etch gallium arsenide.

Where electrochemical etching is employed, the voltage applied during the etching process is preferably one which provides electropolishing which results in a smooth etched surface on the workpiece. In the case of silicon, this apparently involves tetravalent etching. Turner, J. Electrochem. Soc., 105: (1953) 402–408 and Memming et al, Surface Sciences, 4: 1966) 109-124, describe the determination of the critical threshold current density required to achieve anodic electropolishing of semiconductor materials. Optimum parameters of electroetching other semiconductor materials can be determined in a similar manner.

It is noted that during the etching process the area of the film or wafer not to be etched is protected by a mask material. Typically the mask material is one which is removably adherable to the workpiece and which is relatively inert to the etching process. Where an electrochemical etching process is employed the masking material, in addition, should be relatively non-conductive to prevent short circuiting the electrodes. Among others, waxes are useful masking materials.

The ion implantation and etching steps of this invention are not affected by crystal orientation. Thus, the crystal orientation of the semiconductor material workpiece is not critical.

The ultra thin films of this invention can have a thickness of less than two microns and preferably less than one micron. The film thickness obtained is directly proportional to the range of the ion implantation. Films in the range of 1500Å to 100Å are readily attainable. Films as thin as 50Å are contemplated.

After the ultra thin film which comprises the damaged layer of the workpiece is obtained by the etching step, the film is annealed to heal the damage. Annealing is well known in the art and is conducted at a temperature and for a time to heal the implanted ion damage. For example, annealing can be conducted in a vacuum, an equilibrium atmosphere or an inert atmosphere; the choice being governed by the nature of the semiconductor material. Where vacuum is employed, typically it is in the range of $10^{-18}$ to $10^{-6}$ Torr With polyconstituent materials where at least one component may be relatively volatile, such as gallium arsenide, an equilibrium atmosphere is usually employed. Typically annealing temperatures range from 300° to 1100° C. for 30 to 2 minutes.

Applying the technique of FIG. 1, silicon wafers were etched in an anodic etching solution composed of 0.2 Molar ammonium fluoride, and 0.2 Molar hydrofluoric acid, in a 60 percent isopropyl alcohol-water solution. Silicon dissolves in this solution according to the following mechanism:

$$Si + 4H_2O + 4Holes \rightarrow Si(OH)_4 + 4H^+$$

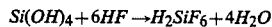

$$Si(OH)_4 + 6HF \rightarrow H_2SiF_6 + 4H_2O$$

[see Memming et al., Surface Science, 4 (1966) 109-124.] Since holes are consumed in the dissolution process, reduction in the number of holes at the silicon electrolyte interface drastically reduces the rate of dissolution of the silicon.

Boron, hydrogen, neon, and phosphorus ions were implanted into different wafers, with doses between $10^1$ and $10^{16}/cm^2$ (see FIG. 2), thus creating a damaged layer near the surface of the silicon. The lifetime of holes in this damaged region is very small, and thus one expects the rate of dissolution of the semiconductor material to slow down considerably when the implanted layer is exposed to the electrolyte. This is in fact observed, and the ratio between the etch rate of the substrate and the implanted silicon was measured to be greater than several thousand to one, thus enabling the fabrication of large area submicron thick semiconductor material films. Since the ion dosage required to limit the dissolution process is quite small, being in the range of $10^{13}$ to $10^{14}/cm^2$ for neon and phosphorus, and since limited films can be produced by implantation of ions that have no electrical activity in the semiconductor material, such as neon, it is possible to produce thin, perfect, single crystal, device quality semiconductor films that have the same characteristics as the bulk semiconductor material used, by simply annealing the films after etching them.

It is noted that the limiting effect is independent of the electrical activity of the implanted ion in silicon, for both donor ions, such as phosphorus, and acceptor ions, such as boron, and even electrically neutral ions such as neon, all give self limited films.

The ion implantation raised the resistivity of the implanted layer from 0.1 ohm-cm (the silicon substrate resistivity) to over several hundred ohm-cm for a dose of $10^{14}$ per $cm^2$ 100 KeV phosphorus ions.

The thickness of the resultant etched silicon films implanted with 120 KeV phosphorus ions, as calculated from Convergent Beam Electron Diffraction (or CBED) patterns using two beam dynamical diffraction theory [Kelly et al., Phys. Stat. Sol., (a) 31 (1975) 771-780], was 155 nm±10 percent, which is in quite close agreement with the projected range of 120 KeV phosphorus ions in silicon, namely 150 nm. The film from which the CBED patterns were obtained was thicker at the center than at the edges due to the geometry of the cathode used in the anodic etching of the film.

EXAMPLE 1

Fabrication of the 150 nm. silicon film upon which the Convergent Beam Diffraction study was made.

Starting with a 0.1 Ohm-cm., p-type, 111 oriented wafer, which had been polished on both sides to 50 micro-meters thickness, a quarter circle, 2.5 cm. on a side, was prepared.

This specimen was then cleaned according to the procedure set forth in ASTM standard F-612.

The cleaned silicon chip was then implanted with 120 KeV phosphorus ions with a dose of $2 \times 10^{13}/cm^2$ in an Accelerators Inc. model 300R ion implanter with a beam current of 7 microamps for 12.8 seconds scanned through a square aperture 5.3 cm. on an edge. The implanted chip was then mounted with the implanted side down on a glass substrate using black Apiezon W wax. A circular area (about 1 mm in diameter) was defined on the surface with black Apiezon W wax. The bare surface area defined by the wax was anodically etched in a solution composed of 0.2 Molar hydrofluoric acid and 0.2 Molar ammonium fluoride in a 60 percent isopropanol-water solution, utilizing the process schematically represented in FIG. 1. The jet 4 was a 0.5 mm diameter stainless steel hypodermic needle-tip and the aspirator 5 was a 1.5 mm teflon tube. The flow rate of the etchant was between 1 and 10 ml per minute. The voltage was empirically chosen to yield a good polished surface. The requisite voltage varied for different specimens, but was in a range of 4 to 30 volts.

The thin films, a roughly circular area of about 0.8 $mm^2$ produced by this process were characterized as follows:

422 Systematic row Convergent Beam Electron Diffraction (CBED) patterns were taken from a film fabricated from a 111 oriented silicon wafer implanted with a dose of $2 \times 10^{13}/cm^2$ of phosphorus at 120 KeV. The thickness of the film was calculated from the patterns using two beam dynamical diffraction theory. The CBED pattern taken from one edge of film showed the thickness was 140 nm. The CBED pattern taken from the center of the film showed the thickness was 171 nm. The CBED pattern taken from the opposite edge of the film showed the thickness was 152 nm. The average thickness was 155 nm±10 percent, quite close to the projected range of 120 KeV phosphorus ions in silicon, namely 150 nm. The film was thicker at the center than at the edges because of the geometry of the cathode used to etch the film.

The resultant films were examined by electron microscope. Ion implantation was detectable. After annealing, reexamination by electron microscope revealed the apparent disappearance of the ion implantation damage.

EXAMPLE 2

Fabrication of a thin Gallium Arsenide film.

A wafer of 100 oriented gallium arsenide (1 cm. by 1 cm.) polished on both sides and doped to $1.81 \times 10^{17}/cm^3$ (resistivity 0.002 ohm-cm.), a thin gallium arsenide film was prepared as follows:

The specimen was cleaned as in Example 1, and then implanted with $10^{11}/cm^2$ Neon ions having an energy of 100 KeV. The equipment was the same as employed in Example 1. The beam current employed was $0.85 \times 10^{-7}$ amperes. The specimen was implanted for 5 seconds through a square aperture 5.3 cm. on an edge.

The implanted chip was then mounted and etched as generally described in Example 1. The etching solution employed was a solution of 2.3 Molar perchloric acid and 14 Molar acetic acid. The anodic etching voltage was chosen empirically to give a good polished surface. The requisite voltage was different for different specimens, but was generally in a range of 4 to 30 volts. Thin submicron films of ion damaged gallium arsenide having a roughly circular area 20 microns in diameter were formed.

The above examples are considered illustrative rather than limiting. All parts and percentages through the specification are by weight unless otherwise specified. All temperatures are degrees Centigrade unless otherwise specified. It is understood that within the scope of the disclosure the invention can be practiced with varying materials and conditions to achieve results within the scope of this invention.

We claim:

1. A method for forming ultra thin semiconductor material films which comprises:
   (a) implanting ions on the reverse side of a semiconductor material film to a predetermined depth of two microns or less, which is a depth less than the thickness of the film, in an amount sufficient to cause a damaged layer in the crystalline structure with damage sufficient to create a significant differential etching dissolution rate between the damaged layer and the remainder of the semiconductor material,
   (b) etching the front side of the semiconductor material by an anodic etching process to remove at least a portion of the undamaged portion of the semiconductor material to expose the damaged layer,
   (c) annealing the resultant exposed damaged layer at a temperature and for a time sufficient to heal the ion implantation damage to thereby provide a thin film of semiconductor material less than two microns in thickness.

2. A method as in claim 1 where the semiconductor material is silicon.

3. A method as in claim 1 wherein the semiconductor material is silicon or germanium and where the ions are selected from Groups III and V of the Periodic Table, an inert gas or hydrogen.

4. A method as in claim 1 wherein the semiconductor material is gallium arsenide and where the ions are selected from Groups II, IV or VI of the Periodic Table, an inert gas or hydrogen.

5. A method as in claim 1 wherein the semiconductor material is selected from the group consisting of silicon, germanium and gallium arsenide.

6. The method as in claims 1 or 5 wherein the resultant thin film has a thickness of less than 1500 Å.

7. A thin annealed unsupported gallium arsenide monocrystalline semiconductor material having a thickness of less than one micron, doped with ions selected from group II and IV of the Periodic Table.

8. A thin annealed germanium monocrystalline etching process-produced semiconductor material having a thickness of less than one micron.

9. The thin semiconductor material of claims 7 or 8, having a thickness of less than 1500Å.

10. A thin annealed undoped monocrystalline etching process-produced semiconductor material selected from the group consisting of silicon, gallium arsenide, germanium, indium arsenide, AlN, GaN, InN, ZnS, CdS, AlP, GaP, InP, ZnSe, CdSe, AlAs, ZnTe, CeTe, AlSb, GaSb, InSb, $InAs_xP_{1-x}$, $Ga_xIn_{1-x}As_yP_{1-y}$ having a thickness of less than one micron.

11. A thin annealed unsupported monocrystalline semiconductor material doped with ions selected from Group II, IV or V of the Periodic Table having a thickness less than one micron and having the same electrical characteristic as the original doped semiconductor material used to create the thin semiconductor material.

12. A thin annealed unsupported monocrystalline undoped semiconductor material or a semiconductor material doped with ions selected from Groups II, IV or V of the Periodic Table having a thickness of less than 1500Å and having the same electrical characteristics as the original undoped or doped semiconductor material used to create the thin semiconductor material.

13. A thin annealed unsupported monocrystalline semiconductor material having a thickness of less than one micron and doped with ions selected from Group V of the Periodic Table.

14. A thin annealed monocrystalline semiconductor film comprising gallium arsenide having a thickness of less than one micron, doped with donor ions.

15. A thin annealed unsupported monocrystalline semiconductor film comprising a material selected from the group consisting of silicon and germanium having a thickness of less than one micron doped with donor ions.

16. A thin annealed monocrystalline etching process-produced semiconductor material comprising a material selected from the group consisting of indium arsenide, AlN, GaN, InN, ZnS, CdS, AlP, GaP, InP, ZnSe, CdSe, AlAs, ZnTe, CdTe, AlSb, GaSb, InSb, $InAs_xP_{1-x'}$ $Ga_xIn_{1-x}As_yP_{1-y}$ and doped diamond, having a thickness of less than two microns.

17. A thin annealed monocrystalline semiconductor material as in claim 16 wherein the thin semiconductor material has the same electrical characteristics as the semiconductor material used to create the thin semiconductor material.

18. The thin annealed monocrystalline semiconductor material of claims 16 or 17 having a thickness of less than one micron.

19. A thin unsupported annealed undoped monocrystalline semiconductor material selected from the group consisting of silicon, allium arsenide, germanium, indium arsenide, AlA, GaN, InW, ZnS, CdS, AlP, GaP, InP, ZnSe, CdSe, AlAs, ZnTe, CdTe, AlSb, GaSb, InSb, $InAs_xP_{1-x}$, $Ga_xIn_{1-x}As_yP_{1-y}$, and doped diamond, having a thickness of less than 1500Å.

20. The thin annealed monocrystalline semiconductor material of claims 7, 8, 10, 11, 14, 15, 16, 17 or 19 having a thickness of less than 1500Å.

21. A thin annealed unsupported monocrystaline semiconductor material comprising gallium arsenide having a thickness of less than 1500Å.

22. A thin annealed monocrystalline unsupported undoped semiconductor material or an unsupported semiconductor material doped with ions selected from groups II, IV or V of the Periodic Table having a thickness of less than one micron and having the same electrical characteristics as the original undoped or doped semiconductor material used to create the thin semiconductor material used to create the thin semiconductor material.

* * * * *